United States Patent
Shappir et al.

(10) Patent No.: US 7,242,618 B2
(45) Date of Patent: Jul. 10, 2007

(54) METHOD FOR READING NON-VOLATILE MEMORY CELLS

(75) Inventors: Assaf Shappir, Kiryat Ono (IL); Eli Lusky, Tel Aviv (IL); Guy Cohen, Yaad (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 11/205,411

(22) Filed: Aug. 17, 2005

(65) Prior Publication Data

US 2006/0126383 A1   Jun. 15, 2006

Related U.S. Application Data

(63) Continuation-in-part of application No. 11/007,332, filed on Dec. 9, 2004.

(51) Int. Cl.
   *G11C 16/06* (2006.01)
(52) U.S. Cl. ............... 365/185.2; 365/185.22
(58) Field of Classification Search ............ 365/185.2, 365/185.22
   See application file for complete search history.

(56) References Cited

U.S. PATENT DOCUMENTS

| | | | |
|---|---|---|---|
| 4,916,671 A | 4/1990 | Ichiguchi | |
| 5,295,108 A | 3/1994 | Higa | |
| 5,590,074 A | 12/1996 | Akaogi et al. | |
| 5,768,193 A | 6/1998 | Lee et al. | |
| 5,774,395 A | 6/1998 | Richart et al. | |
| 5,812,449 A | 9/1998 | Song | |
| 6,034,896 A | 3/2000 | Ranaweera et al. | |
| 6,064,226 A | 5/2000 | Earl | |
| 6,078,518 A * | 6/2000 | Chevallier | 365/185.03 |
| 6,122,198 A | 9/2000 | Haddad et al. | |
| 6,128,227 A | 10/2000 | Kim | |
| 6,163,484 A | 12/2000 | Uekubo | |
| 6,205,059 B1 | 3/2001 | Gutala et al. | |
| 6,215,697 B1 | 4/2001 | Lu et al. | |
| 6,219,290 B1 | 4/2001 | Chang et al. | |
| 6,252,442 B1 | 6/2001 | Malherbe | |
| 6,307,807 B1 | 10/2001 | Sakui et al. | |
| 6,324,094 B1 | 11/2001 | Chevallier | |
| 6,353,554 B1 | 3/2002 | Banks | |
| 6,400,607 B1 | 6/2002 | Pasotti et al. | |
| 6,438,035 B2 | 8/2002 | Yamamoto et al. | |
| 6,449,190 B1 | 9/2002 | Bill | |
| 6,456,528 B1 | 9/2002 | Chen | |
| 6,490,204 B2 | 12/2002 | Bloom et al. | |
| 6,519,180 B2 | 2/2003 | Tran et al. | |
| 6,522,585 B2 | 2/2003 | Pasternak | |
| 6,552,387 B1 | 4/2003 | Eitan | |

(Continued)

FOREIGN PATENT DOCUMENTS

EP    1217744    3/2004

*Primary Examiner*—Hoai V. Ho
(74) *Attorney, Agent, or Firm*—Eitan Law Group

(57) ABSTRACT

A method includes changing a read reference level for reading a group of memory cells as a function of changes in a threshold voltage distribution of a different group of memory cells. The changing step includes determining a history read reference level of a group of history cells associated with a group of memory cells of a non-volatile memory cell array, allowing correct reading of the group of history cells, selecting a memory read reference level according to the first read reference level, and reading the non-volatile memory array cells.

30 Claims, 9 Drawing Sheets

U.S. PATENT DOCUMENTS

| | | |
|---|---|---|
| 6,577,532 B1 | 6/2003 | Chevallier |
| 6,639,849 B2 | 10/2003 | Takahashi et al. |
| 6,649,972 B2 | 11/2003 | Eitan |
| 6,731,542 B1 | 5/2004 | Le et al. |
| 6,738,289 B2 | 5/2004 | Gongwer et al. |
| 6,856,550 B2 * | 2/2005 | Kato et al. ............ 365/185.28 |
| 6,912,160 B2 | 6/2005 | Yamada |
| 6,937,523 B2 | 8/2005 | Eshel |
| 6,967,872 B2 | 11/2005 | Quader et al. |
| 6,996,692 B2 | 2/2006 | Kouno |
| 2003/0028709 A1 | 2/2003 | Micheloni et al. |
| 2005/0140405 A1 | 6/2005 | Do et al. |

* cited by examiner

METHOD FOR READING NON-VOLATILE MEMORY CELLS

CROSS-REFERENCE TO RELATED APPLICATIONS

This application is a continuation-in-part application claiming benefit from U.S. patent application Ser. No. 11/007,332, filed Dec. 9, 2004, which is hereby incorporated by reference.

FIELD OF THE INVENTION

The present invention relates to non-volatile memory cells generally and to methods of reading them in particular.

BACKGROUND OF THE INVENTION

Dual bit memory cells are known in the art. One such memory cell is the NROM (nitride read only memory) cell 10, shown in FIG. 1 to which reference is now made, which stores two bits 12 and 14 in a nitride based layer 16 sandwiched between a conductive layer 18 and a channel 20. NROM cells are described in many patents, for example in U.S. Pat. No. 6,649,972, assigned to the common assignees of the present invention, whose disclosure is incorporated herein.

Bits 12 and 14 are individually accessible, and thus, may be programmed (conventionally noted as a '0'), erased (conventionally noted as a '1') or read separately. Reading a bit (12 or 14) involves determining if a threshold voltage Vt, as seen when reading the particular bit, is above (programmed) or below (erased) a read reference voltage level RD.

FIG. 2, to which reference is now made, illustrates the distribution of programmed and erased states of a memory chip (which typically has a large multiplicity of NROM cells formed into a memory array) as a function of threshold voltage Vt. An erased bit is one whose threshold voltage has been reduced below an erase threshold voltage EV. Thus, an erase distribution 30 has typically its rightmost point in the vicinity of (and preferably at or below) the erase threshold voltage EV. Similarly, a programmed bit is one whose threshold voltage has been increased above a program threshold voltage PV. Thus, a programmed distribution 32 has typically its leftmost point in the vicinity of (and preferably at or above) the program threshold voltage PV.

The difference between the two threshold voltages PV and EV is a window W0 of operation. Read reference voltage level RD is typically placed within window W0 and can be generated, as an example, from a read reference cell. The read reference cell is usually, but not necessarily, in a non-native state, as described in U.S. Pat. No. 6,490,204, assigned to the common assignee of the present invention, whose disclosure is incorporated herein by reference. In such case, the threshold voltage of read reference cell may be at the RD level in FIG. 2.

The signal from the bit being read is then compared with a comparison circuit (e.g. a differential sense amplifier) to the signal generated by the read reference level, and the result should determine if the array cell is in a programmed or erased state. Alternatively, instead of using a reference cell, the read reference signal can be an independently generated voltage or a current signal. Other methods to generate a read reference signal are known in the art.

Since the sensing scheme circuitry may not be perfect, and its characteristics may vary at different operating and environmental conditions, margins M0 and M1 are typically required to correctly read a '0' and a '1', respectively. As long as the programmed and erased distributions are beyond these margins, reliable reads may be achieved.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
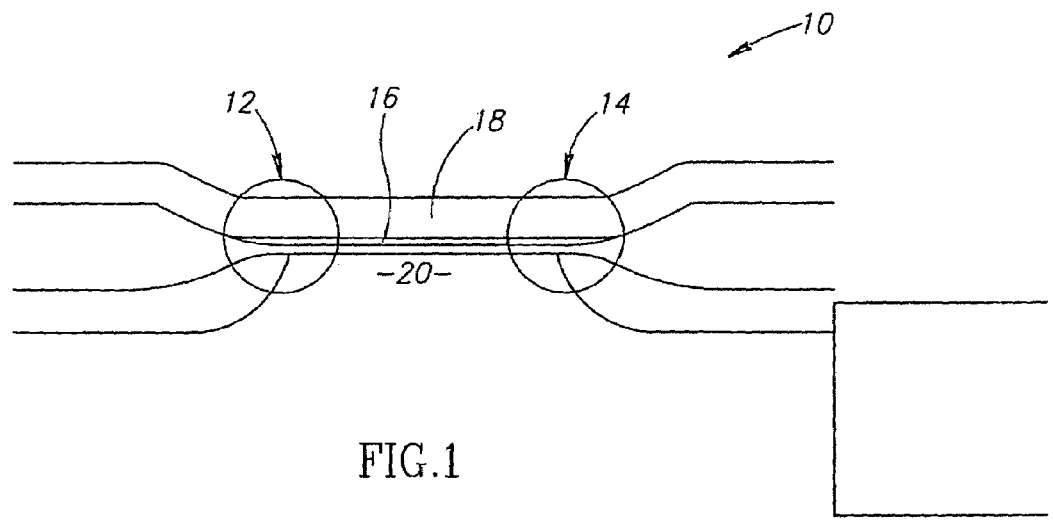
FIG. 1 is a schematic illustration of a prior art NROM cell.
Figure 2:
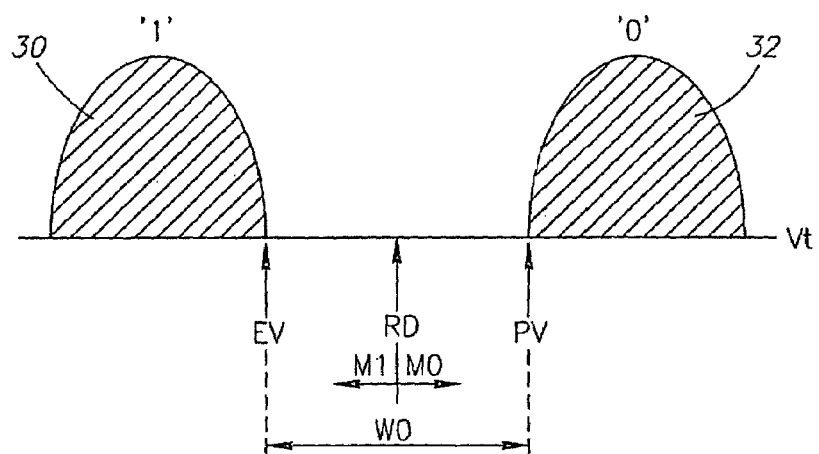
FIG. 2 is a schematic illustration of the distribution of programmed and erased states of a memory chip of NROM cells as a function of threshold voltage Vt.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that the window of operation may change over time as the cells go through multiple erase and programming cycles. The window of operation may shrink and/or may drift, both of which may affect the accuracy of the read operation.

Figure 3:
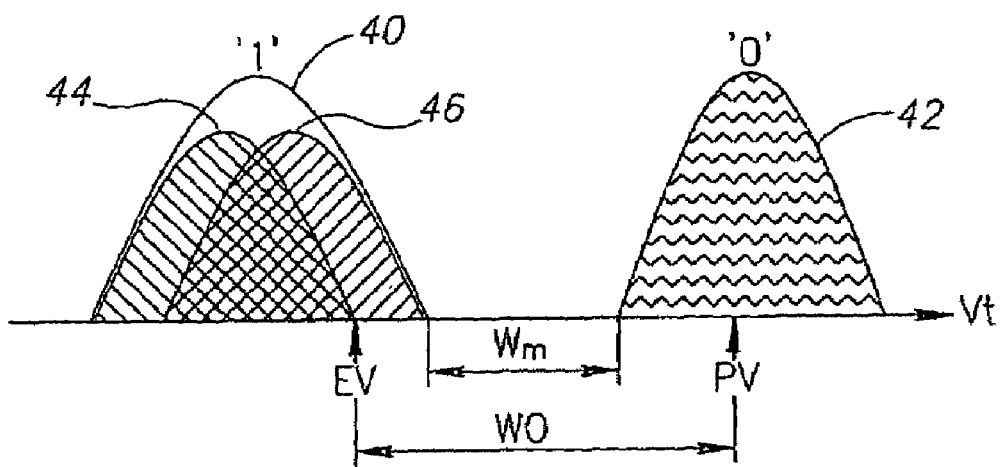
FIG. 3 is a schematic illustration of erase and programmed distributions at some point after the start of operation of an exemplary memory array.

Reference is now made to FIG. 3, which illustrates erase and programmed distributions 40 and 42, respectively, at some point after the start of operation of an exemplary memory array.

Although each bit may be erased to a threshold voltage below erase voltage EV, erase distribution 40 may appear to be shifted slightly above erase voltage EV. Applicants have realized that this may be due to the fact that the two bits of a cell have some effect on each other. If both bits are erased, then the threshold voltage of each bit may be below erase voltage EV (as indicated by the smaller distribution 44 within erase distribution 40). However, if one of the bits is programmed while the other bit is erased, the threshold voltage of the erased bit may appear higher, due to the programmed state of the other bit. This is indicated by the second small distribution 46 within erase distribution 40, some of whose bits may have threshold voltages that appear to be above erase voltage EV. This is typically referred as a "second bit effect". Additionally, erased bits may appear to be shifted slightly above erase voltage EV due to charge redistribution within the trapping layer and unintentional charge injection into the trapping layer.

Applicants have additionally realized that, after repeated program and erase cycles, programmed distribution 42 may shift below programming voltage PV. This may be due to the retention properties of the cells after erase/program cycles. This downward shift of the programmed distribution 42 is time and temperature dependent, and the shift rate also depends on the number of program/erase cycles that the cell has experienced in its past.

The result of these shifting distributions may be to shrink the window of operation to a different window Wm of operation. Applicants have realized that the different window Wm may or may not be aligned with the original window W0. FIG. 3 shows an exemplary window Wm with its center shifted from the center of the original window W0. Applicants have realized that one or both of these changes may have an effect on the quality of the read operation. This is illustrated in FIG. 4, to which reference is now made.

Figure 4:
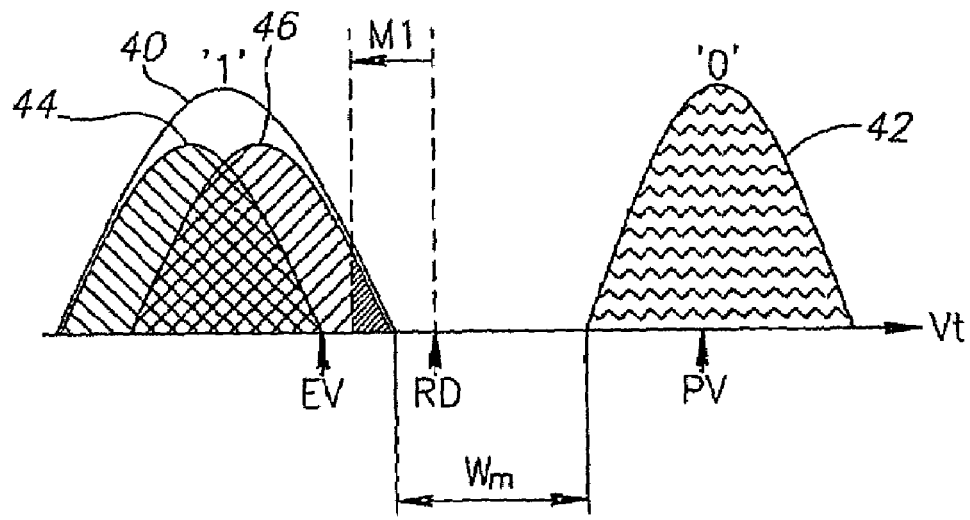
FIG. 4 is a schematic illustration of a reduction in the designed margin occurring as an outcome of the erase distribution shift illustrated in FIG. 3.

FIG. 4 is similar to FIG. 3 but with the addition of a read reference level RD and its associated design margin M1. Prior art requires that the read reference level RD be located according to the expected program and erase margin loss. Typically, program margin loss is larger, and thus, in FIG. 4, read reference level RD is allocated closer to the erase verify level EV to guarantee correct reading of the program state bit after retention loss occurs. The distance between read reference level RD and erase verify level EV is the total erase margin provided to assure correct reading of the erase state bits. Out of the total erase margin, margin M1 may be required to compensate for circuit deficiencies and to ensure a correct read of an erased bit. The original placement of the erased bits below the EV level (typically after an erase operation), provided a larger than M1 margin, and thus a reliable read of '1' bits. Unfortunately, as shown in FIG. 4, since erase distribution 40 may have drifted above erase threshold voltage EV, margin M1 may no longer be maintained. There may be some bits within erase distribution 46, indicated by solid markings, which may be wrongly read (i.e. read as programmed) since their threshold voltages are not below margin M1.

Figure 5A:
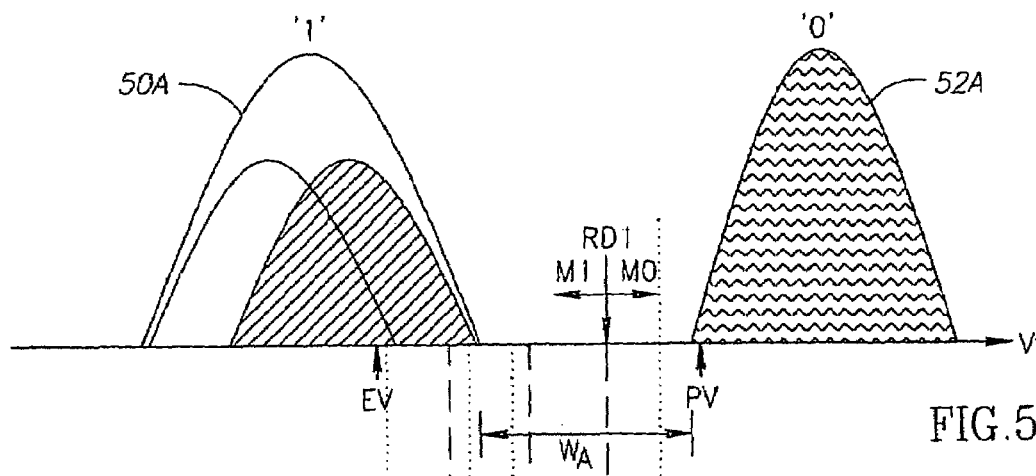
FIGS. 5A, 5B and 5C are schematic illustrations of a method of reading memory cells, constructed and operative in accordance with the present invention, using a moving read reference level which may move as a function of changes in the window of operation.
Figure 5B:
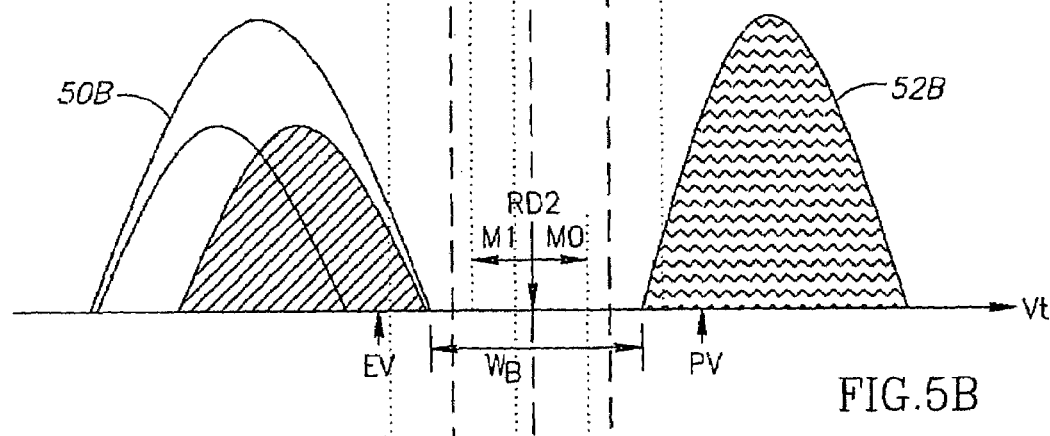
Figure 5C:
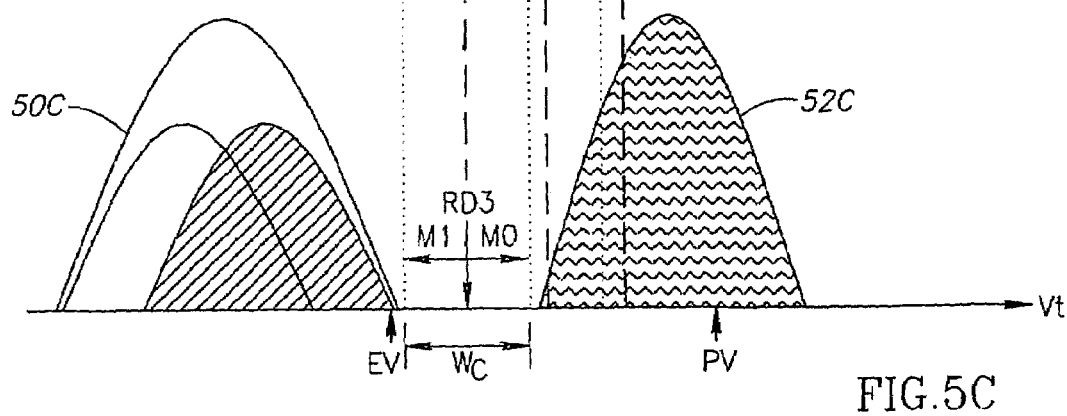

Reference is now made to FIGS. 5A, 5B and 5C, which together illustrate a method of reading memory cells, constructed and operative in accordance with the present invention, using a moving read reference level MRL, which may move as a function of changes in the window of operation.

In accordance with a preferred embodiment of the present invention, shortly after an erase and a program operation (FIG. 5A), moving read level MRL may be placed at a read level RD1 between an erase distribution 50A and a programmed distribution 52A, where erase distribution 50A is now slightly above erase threshold voltage EV (due to the second bit effect) and programmed distribution 52A is now entirely or almost entirely above programming threshold voltage PV. Suitable margins M1 and M0 may be defined from read level RD1 to overcome circuit and sensing scheme deficiencies and to ensure correct detection of the bit states. In FIG. 5A, the erase and program distributions are beyond margins M1 and M0, respectively. Therefore, at this point, read level RD1 may successfully and reliably read both 1's and 0's.

If the cells have already passed multiple programming and erase cycles, then, after a period of time, the distributions may shift. In FIG. 5B, the program distribution, now labeled 52B, has moved lower and thus, a significant part of it is below program threshold voltage PV. However, the erase distribution, here labeled 50B, has typically also moved lower. Even if the window of operation $W_B$ is close to or the same width as that in FIG. 5A (labeled $W_A$), its center has changed. As a result, read reference level RD1 with margin M0 may no longer correctly read all the bits in the program distribution 52B as '0'.

In accordance with a preferred embodiment of the present invention, for the situation of FIG. 5B, moving read level MRL may move to a second read level RD2. In this situation, when reading bits with reference to read level RD2, margins M0 and M1 are maintained, but relative to the shifted RD2 read level, and therefore all the bits in both distributions (50B and 52B) may be correctly read as erased ('1') or programmed ('0').

FIG. 5C shows a third case where the distributions may have shifted further, resulting in a window of operation $W_C$ that is further shrunk and/or shifted. In accordance with a preferred embodiment of the present invention, moving read level MRL may move to a third read level RD3 (along with margins M0 and M1) to accommodate the changed window of operation, and to ensure a reliable read of all the bits in the distributions 50C and 52C.

It will be appreciated that read levels RD1 and RD2 would not successfully read the distribution of FIG. 5C. Both read levels RD1 and RD2 would erroneously read at least some of the 1's (since the distance of the left side of the program distribution 52C to the read level is smaller than the required margin M0). Similarly, third read level RD3 would erroneously read some of the 1's had it been used for the distributions of FIGS. 5A and 5B since the right sides of distributions 50A and 50B do not maintain a required margin M1 from the read level RD3.

Figure 6A:
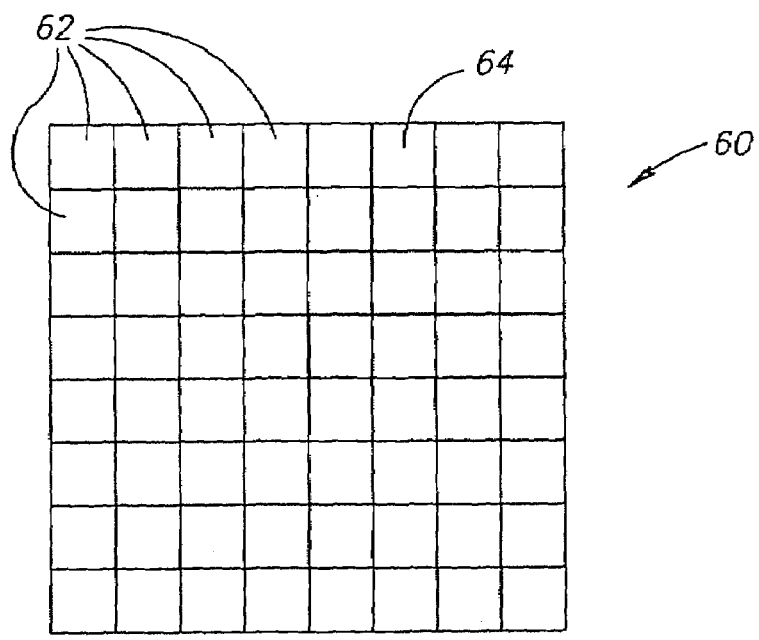
FIGS. 6A, 6B, 6C and 6D are schematic illustrations of alternative locations of history cells and memory cells, useful in implementing the method of FIGS. 5A, 5B and 5C.

Selecting which read level to utilize at any given time may be done in any suitable manner and all such methods are included in the present invention. An example is shown in FIG. 6A, to which reference is now made. In this example, the memory array, labeled 60, may comprise memory cells 62 to be read and history cells 64. At least one history cell 64 may be associated with a subset of memory cells 62 and may pass through substantially the same events and preferably substantially at the same time and with the same conditions as its corresponding subset of memory cells 62.

Figure 6B:
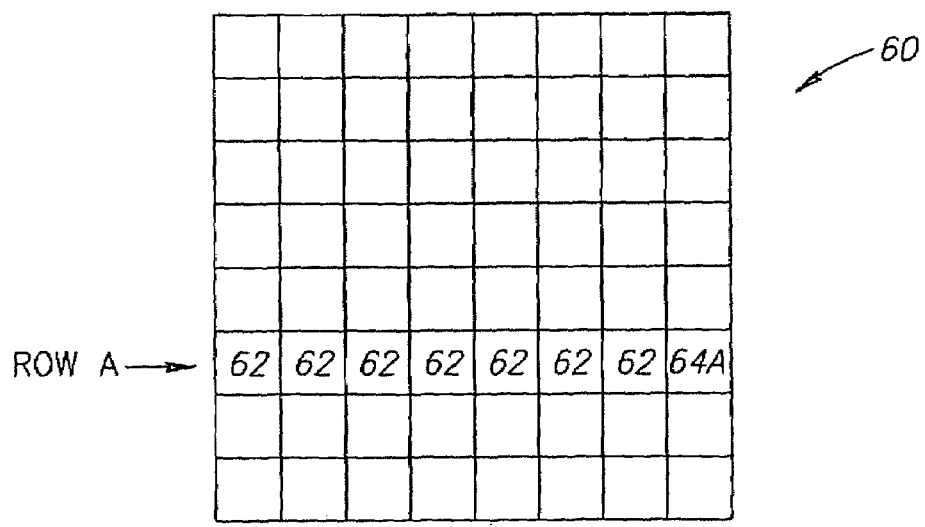

A specific example is shown in FIG. 6B, to which reference is now made. In this example, a history cell 64A may be associated with a row A of memory cells 62 and may be programmed and erased at the same time as cells 62, always being brought back to its known predetermined state. This predetermined state may be, for example, such that both bits (i.e. both storage areas) of the cell are in a programmed state, or, in a different case, only one of the bits is in a programmed state while the other bit remains erased.

Figure 6C:
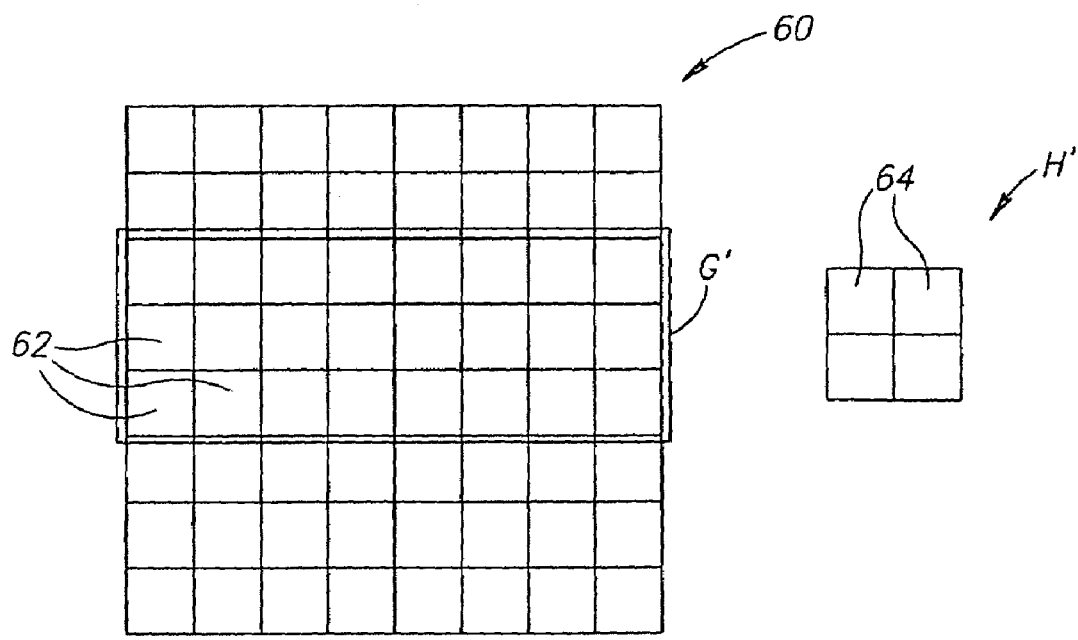

Another example is shown in FIG. 6C, to which reference is now made. In this example, a set H' of history cells 64 may be associated with a section G' of memory cells 62 in array 60. The set H' of history cells 64 may be anywhere in the memory array as long as the cells therein pass through substantially the same events at substantially the same conditions as memory cells 62 of section G' with whom they are associated. The history cells 64 are always brought back to a predetermined state. Some of the history cells 64 may have both bits (i.e. both storage areas) in a programmed state while other history cells may have only one of their bits in a programmed state.

Figure 6D:
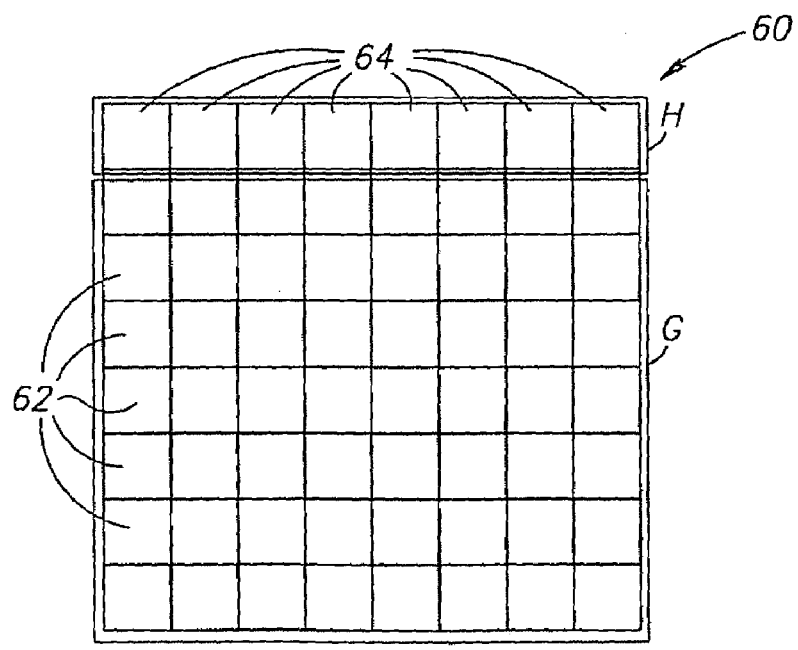

In FIG. 6D, a set H of history cells 64 may be a row of cells next to a section G of array 60. Typically, each such row may have 512–1K cells while there may be 256–512 rows in section G.

The history cells 64 may be utilized to determine the most appropriate reference read level to use for reading the subset of memory cells 62 to which they are associated. The reference read level, or more preferably, the highest reference read level, that may produce a correct readout of history cells 64 (a '0' readout, since the history cells 64 typically are in a programmed state) may be utilized with or without added margin to read its associated subset of memory cells 62.

The reference read level used to correctly read history cells 64 may be known as a "history read reference level". The associated subset of memory cells 62 may be read with a "memory read reference level" which may be the same as the history read reference level or it may have a margin added to it.

Figure 7:
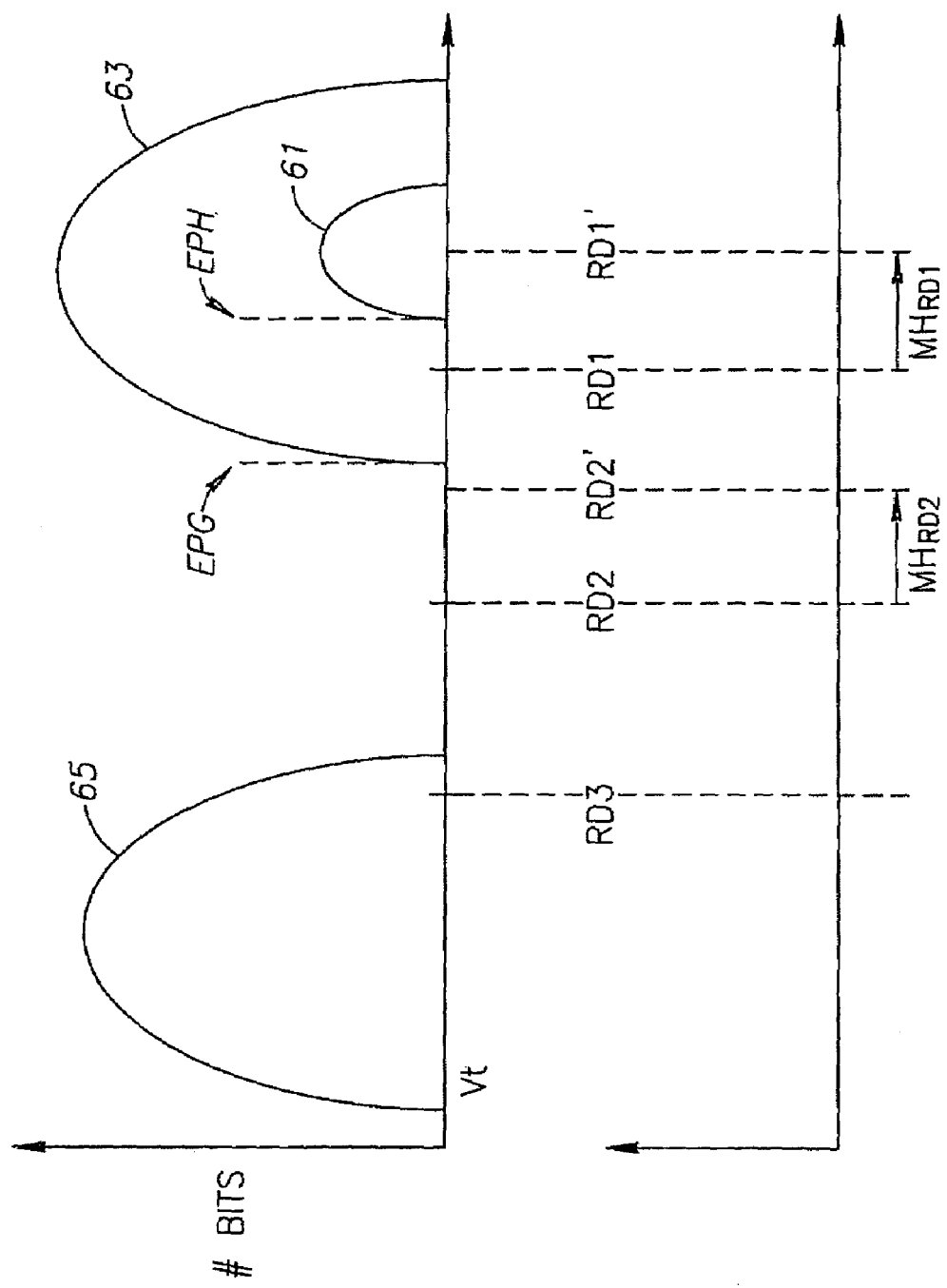
FIG. 7 is a schematic illustration of a method of determining a history read reference level and a memory read reference level for the history cells and memory cells of FIGS. 6A, 6B, 6C and 6D.

Reference is now made to FIG. 7, which shows two program distributions 61 and 63 and an erase distribution 65. Program distribution 61 may be the program distribution for history cells 64 shown in FIG. 6D, and program distribution 63 may be the program distribution for the group G of array cells 62 in array 60 with which history cells 64 may be associated. Because a lesser number of history cells 64 may represent a larger number of array cells 62, distribution 61 is shown in FIG. 7 to be smaller than distribution 63. Accordingly, an edge EPH of program distribution 61 may be located at a higher voltage than an edge EPG of program distribution 63.

FIG. 7 shows two history read levels RD1' and RD2' for defining the history read reference levels and three associated memory read levels RD1, RD2 and RD3, where RD1'>RD2' and RD1>RD2>RD3.

History program distribution 61 may first be checked with history read level RD1'. If, as shown in FIG. 7, part of history cells 64 are read as erased when read level RD1' is used, then history read level RD2' may be used to read history cells 64. In this example, history read level RD2' may be successful in reading history cells 64 and, accordingly, their associated subset G of memory cells 62 maybe read using its associated memory read reference level RD2. In the embodiment of FIG. 7, the lowest history read reference level, which, in this example is RD2', may be associated with either read level RD2 (when all of the history cells are read with history read level RD2' as programmed) or with read level RD3 (when part of the history cells are read with RD2' as erased).

FIG. 7 shows margins $MH_{RDi}$ between each history read level RDi' and its associated memory read level RDi. In the example of FIG. 7, the margins $MH_{RDi}$ may be defined as a projected difference EPH–EPG associated with the different number of bits in distributions 61 and 63. It will be appreciated that margin $MH_{RDi}$ may be defined in any other suitable manner.

Thus, to generalize, if part of set H of programmed history cells 64 are incorrectly read using history read level RD(j)' (i.e. they are read as erased), but correctly read using history read level RD(j+1)', then the associated subset G of memory cells 62 may preferably be read using the RD(j+1) memory read reference level. For this, there may be the same number of history read reference levels as memory read reference levels.

Alternatively and as discussed hereinabove with respect to FIG. 7, there may be one less history read reference level than memory read reference level. In this embodiment, the lowest level RD(j)' may provide two levels correct reading of the lowest level RD(j)' may be associated with the RD(j) level while incorrect reading may be associated with the RD(j+1) level.

The most appropriate reference read level to be used for reading each of the subsets G of memory cells 62 may be determined in any one of a number of ways, of which four are described hereinbelow.

A) reading all or part of the history cells 64 vs. all or part of existing read reference cells having read reference levels RD(j).

B) reading all or part of the history cells 64 vs. specific reference cells placed at the read reference levels RD(j) plus some margin MH, where MH may be the projected difference EPH–EPG or any other suitable margin. Alternatively, there may be separate margins MH(j) for each read level RD(j).

C) reading all or part of the history cells 64 vs. all or part of the existing read reference cells having read reference levels RD(j) but activating the word lines of the history cells 64 at a different level than the word line of the read reference cells, in order to introduce some margin.

D) reading all or part of the history cells 64 vs. all or part of the existing read reference cells having read reference levels RD(j) but introducing some margin MH(j) at each of these read operations, for example by adding or subtracting a current or voltage signal to the signals of at least one of the history or the read reference cells.

These operations may be performed "on the fly" (before reading the associated subset G of memory cells 62) in applications that allow sufficient time to read the history cells 64 vs. the different history read reference levels and to determine the optimal memory read reference level for reading the associated subset G of memory cells 62. Alternatively, the history cells 64 may be read at predetermined times and, after analyzing the readouts and choosing the appropriate history read reference level, the results may be stored for later use when a read of memory cells 62 may be required. Such predetermined times may be at power-up of the device, prior to or after long operations (e.g. program or erase) or at idle times. The history cells 64 may be read serially, in parallel, and in a mixed serial/parallel form.

The history cells 64 may be of the same type of multi bit NROM cells as the array memory cells 62. They may be operated in a one bit per cell mode, in a dual bit per cell mode, or in a multilevel mode. The programmed state of history cells 64 may be achieved by programming only one or both bits in their cells. The history cells 64 may be erased close to, together with, or while erasing their associated memory cells 62. The programming of the history cells may be performed shortly after erasing them and their associated memory cells 62, or close to programming a subset of bits in their associated memory cells 62.

Applicants have realized that the efficacy of the moving read level method described in the present invention may be dependent upon the judicious placement of the memory read reference level so that incorrect reads of cells due to a diminished margin between the read level and the program and erase threshold voltages may not occur. As described hereinabove, the memory read reference level may be located on the basis of the history read reference level which is a function of history cells 64.

Figure 8:
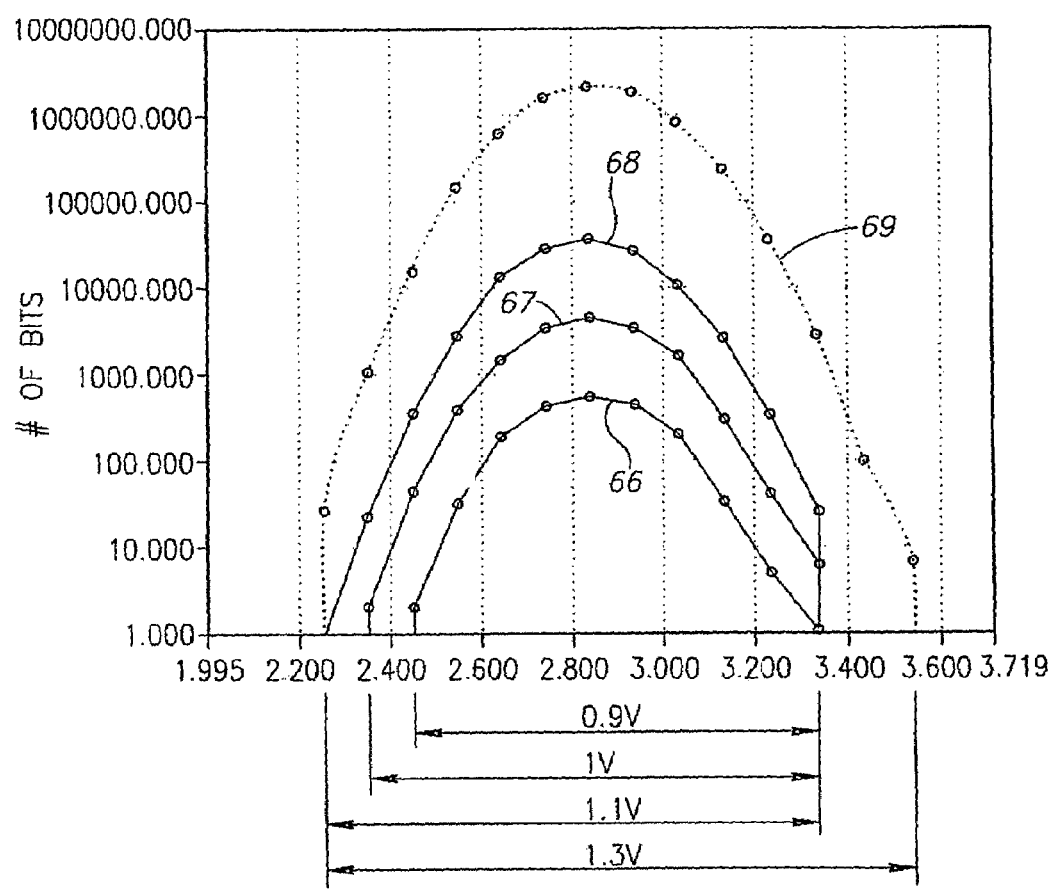
FIG. 8 is a schematic illustration of program threshold distributions of variously sized subgroups of memory cells in an NROM array.

Applicants have realized that a group of history cells 64 may be limited in its ability to faithfully represent its associated group of memory cells 62 due to a statistical phenomenon which is illustrated in FIG. 8. FIG. 8 illustrates that the ability of a subgroup, such as a group H of history cells 64, to faithfully represent the larger group of which it is a part, i.e. group G or G', is inherently imperfect. In FIG. 8, program threshold distributions 66, 67, 68 and 69 are shown for variously sized subgroups of memory cells in an NROM array. Curve 66 represents the program threshold distribution for a group of 800 memory cells, and the number of cells in the groups represented by curves 67, 68 and 69 are 7 thousand, 60 thousand and 3 million memory cells respectively. In accordance with statistical laws governing normal distributions such as program threshold distributions for a group G of memory cells 62 in an array 60, the larger the subgroup of memory cells, the wider its range of program threshold values. This is illustrated in FIG. 8 with the largest group of cells (curve 69) spanning a range of 1.3 V, and the smallest group of cells (curve 66) spanning a range of 0.9 V. The intermediate sized subgroups represented by curves 67 and 68 span ranges of 1V and 1.1 V respectively, as shown in FIG. 8.

Applicants have realized, therefore, that in a preferred embodiment of the present invention, the closer the number of history cells 64 in subset H approaches the number of cells in the array group G they are intended to represent, the more representative the sampling may be and the more effective the read level determined therefrom may be.

Figure 9:
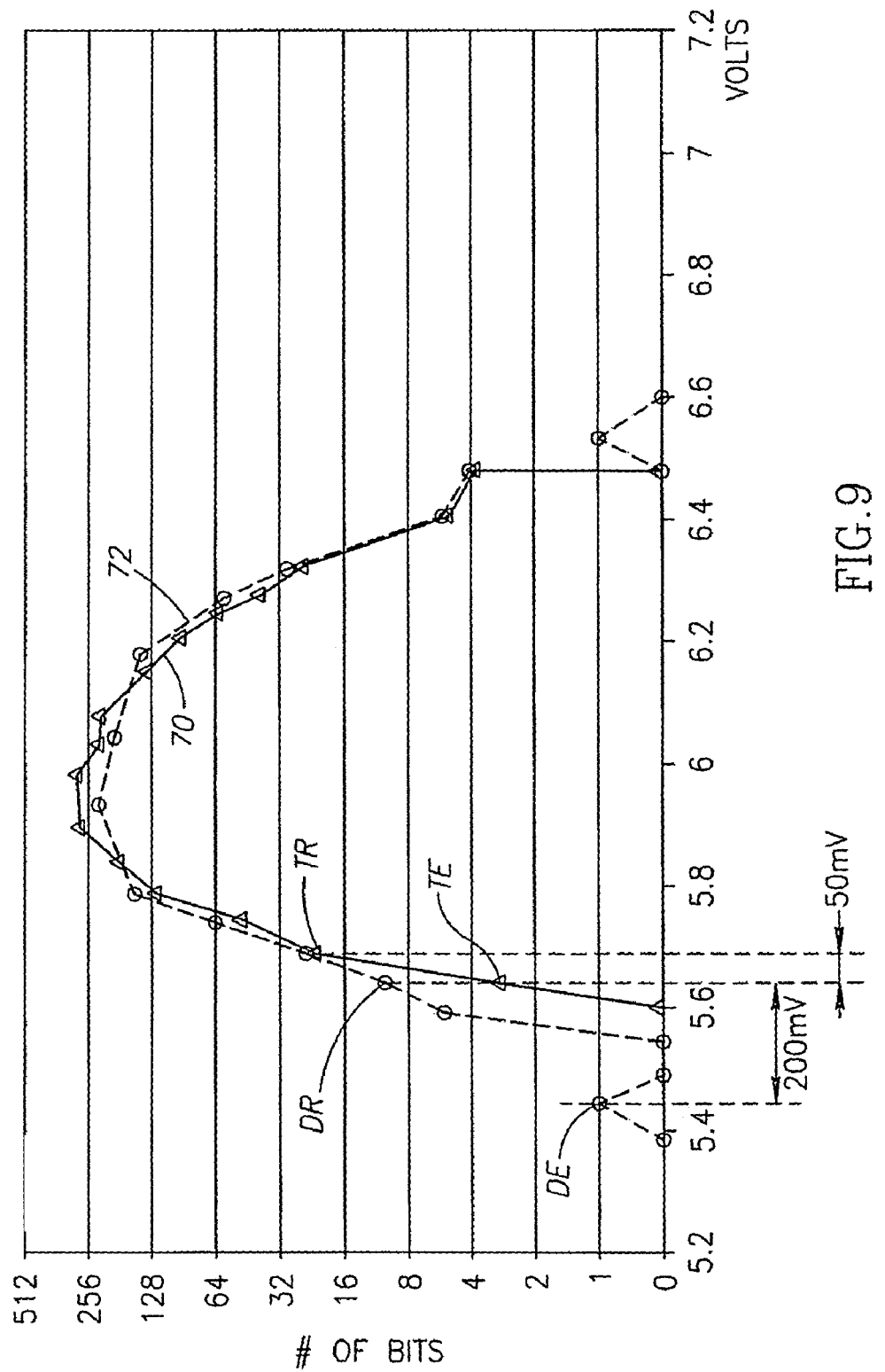
FIG. 9 is a schematic illustrative comparison between a smooth program threshold distribution and one with statistically jagged edges, useful in illustrating an alternative method of determining a read reference level in accordance with the present invention.

FIG. 9, reference to which is now made, shows an additional statistical characteristic of voltage distributions in cell subgroups of NROM arrays which may be addressed to improve the efficacy of a moving read level whose location is determined based on group H of history cells 64. FIG. 9 shows two threshold voltage distributions 70 and 72 for two subgroups of programmed NROM cells from the same array with an identical history. Distribution 70 is indicated with triangles and distribution 72 is indicated with dots. As may be seen in FIG. 9, the distributions show a very high degree of overlap, however, dot distribution 72 exhibits some "noise" at the edges, i.e., errant data points which fall outside the general pattern of the dot distribution. At the noisy left edge of dot distribution 72, with a threshold voltage of 5.45V, there is a point DE representing one bit. However, in triangle distribution 70, which exhibits no noise at the left edge, the smallest point on the left, labeled TE, is at 5.65V and represents 3 bits.

It is shown in FIG. 9 that, in the statistical event of an errant data point, using the lowest threshold voltage value Vtp of one group of history cells to establish the history read level may introduce significant uncertainty, as evidenced by the 200 mV discrepancy between analogous edge points on the program distributions of the two subgroups of the same array. Applicants have therefore realized that it may be preferable to determine the history read reference level at a point beyond the edges of the distributions where statistical noise may occur.

An exemplary point DR beyond the noisy edge of dot distribution 72 is indicated in FIG. 9. DR, located at 5.65V, represents 10 bits. It is the first point in dot distribution 72 where eight or more programmed cells would be sensed incorrectly as erased if the program threshold voltage was set at this point. The analogous point TR in triangle distribution 70 represents 24 bits and is located at 5.7V. It may be seen by a comparison of the 50 mV discrepancy between the threshold voltage values of non-edge points DR and TR and the 200 mV discrepancy between the threshold voltage values of edge points DE and TE that a non-edge point may provide a more meaningful reference point for a greater number of subgroups belonging to a single larger group, such as history group H associated with array group G.

Therefore, in accordance with a preferred embodiment of the present invention, a history read reference level and memory read reference level may be determined based on the threshold voltage distribution of history cells 64 as follows:

a) The history read reference level may be set to the program threshold voltage which is the Xth lowest threshold voltage in the distribution, where X may be between 1 and N, where N is the number of cells (for single bit cells) or bits (for multi-bit cells) in the distribution. The role of X is to reduce statistical uncertainty by avoiding the noisy edges of the distributions.

b) The memory read reference level, for sensing the associated group of cells in the array, may be set to a value based on the history read reference level with an additional margin added to it.

Applicants have further realized that the method by which history group H of history cells 64 and its associated array group G of memory cells 62 may be programmed, and the method by which such history cells 64 and array cells 62 may be erased may also be performed, in accordance with a preferred embodiment of the present invention, so as to maximize the match between history group H and array group G that they represent.

In accordance with an additional preferred embodiment of the present invention, history group H may be programmed after an intentional wait period introduced following their erasure, so that the time lapse between the erasure and programming of history group H may match the time lapse between the erasure and programming of their associated array group G, thus making history group H a better representative sample of array cells G.

In accordance with a further additional embodiment of the present invention, erase operations of array group G may be partitioned into subgroups, as is described in Applicants' co-pending application entitled "A Method of Erasing Non-Volatile Memory Cells" U.S. application Ser. No. 11/205,716 filed on the same day herewith and hereby included by reference. Applicants have realized that erasing memory cells in small groups may enhance the uniformity of these small groups of memory cells and their behavioral match with their associated history cells by preventing over-erasure of cells. Erasing cells in small groups may prevent over-erasure of cells by preventing the exposure of many memory cells, most of which may be successfully erased after a few erase operations, to repetitive erase operations necessary to erase only a few stubborn cells. Since a row of an array may typically be erased at very few erase pulses, this embodiment may be implemented by forming the small groups from rows of array 60.

Figure 10A:
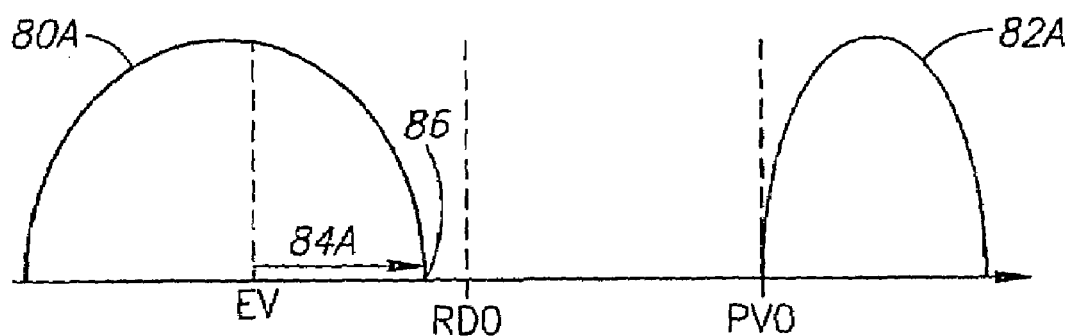
FIGS. 10A and 10B are schematic illustrations of program and erase threshold distributions illustrating the method of reducing a program verify level in accordance with the present invention.
Figure 10B:
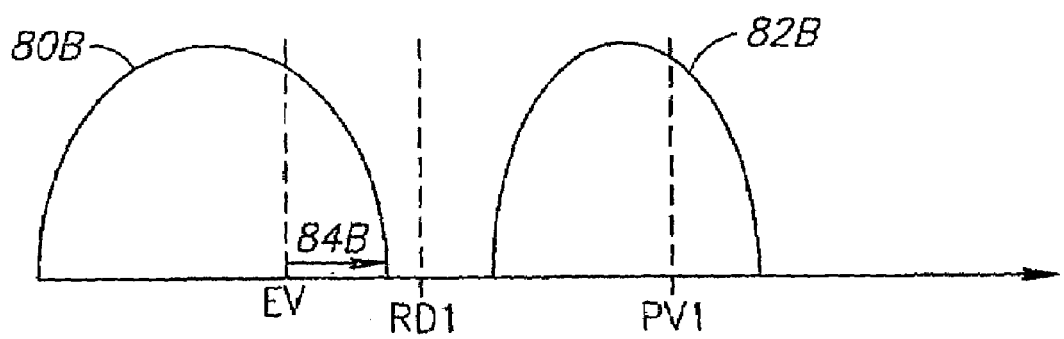

The efficacy of the moving read level method may also be enhanced by addressing the method by which array group G may be programmed. FIGS. 10A and 10B, reference to which is now made, illustrate how programming array group G in accordance with a preferred embodiment of the present invention may support the moving read level method of the present invention.

FIG. 10A shows an erase distribution 80A and a program distribution 82A after cycling while FIG. 10B shows an erase distribution 80B and a program distribution 82B after a retention bake after cycling.

It is shown in FIG. 10A that program distribution 82A is located completely above program verify level PV0, which is located at the leftmost edge of program distribution 82A. Erase distribution 80A on the other hand, extends past the erase verify level, EV. Applicants have realized that this overlap may be due to a "second bit effect" in which there is some electrical cross talk between the two bits in a dual bit cell when one bit is programmed and one bit is erased. Such a cross-talk results in an apparent increase in the threshold voltage of the erased bit due to the influence of its neighboring programmed bit. The accumulated threshold voltage increases in the erased bit neighbors of programmed bits cause the overlap of erased distribution 80A over erase verify level EV.

In FIG. 10A, in order to accommodate the second bit effect and provide accurate reads of all the erased bits, moving read level RD0 has moved to the right to establish a margin between an edge 86 of distribution 80A and read level RD0.

FIG. 10B illustrates the relative positions of program and erase distributions 82B and 80B respectively after a "retention after cycling" operation. A retention after cycling operation may be performed to emulate the capability of the chip to store the correct data for a long period of time after a large number of program and erase cycles has been performed. It involves cycling the bits between programming and erased states a large number of times (e.g. 100,000 cycles) and baking the chip for a pre-defined period of time. It is shown in FIG. 10B that both program distribution 82B and erase distribution 80B have shifted down, and the more extreme shift of program distribution 82B has caused a severe reduction of the sensing window between the rightmost edge of erase distribution 80B and the leftmost edge of program distribution 82B.

In accordance with a preferred embodiment of the present invention, in order to enhance the efficacy of a moving read level by providing a wider sensing window in which it may be located, a program verify level PV1 at which additional programming (without an erase operation performed) may be performed may be lowered in order to reduce the second bit effect and to keep the encroachment of the rightmost edge of erase distribution 80B on the sensing window at bay. This may imply that the overlap of the erase distribution with the EV level may decrease such that leftmost edge 84B may be less than leftmost edge 84A. Thus, moving read level RD1 may still be located between the distributions 80B and 82B and allow continued functionality of the cells.

In accordance with a preferred embodiment of the present invention, the program verify level may be returned to its initial level PV0 after an erase operation may be performed on the array or on a section of the array which utilizes lower program verify level PV1. This may be because, after erasure, the cells may be returned to a state closer to their natural state.

Moreover, the history read reference level and the memory read reference level may also be returned to their original levels after the erasure operation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising: determining a memory read reference level based on program threshold voltage levels of a group of history cells associated with a group of memory cells belonging to a non-volatile memory cell array, reading said memory cells of said array using said memory read reference level, wherein said determinining comprises reading said group of history cells with respect to at least one of a set of possible multiple history read reference levels; and selecting a memory read reference level according to said reading history cells.

2. The method according to claim 1 wherein said history read reference level is equal to said memory read reference level.

3. The method according to claim 1 wherein said history read reference level is not equal to said memory read reference level.

4. The method according to claim 3 wherein said non-equality depends on a predetermined margin to be maintained between readout of said group of history cells and the readout of its associated said memory array cells.

5. The method according to claim 1 wherein said the number of history read reference levels is different than the number of memory read reference levels.

6. The method according to claim 1 and also comprising having read reference cells and activating word lines of said history cells at a different level than word lines of said read reference cells.

7. The method according to claim 1 and comprising having said group of history cells pass substantially the same events at substantially the same conditions as said associated memory cells.

8. The method according to claim 1 and wherein the quantity of cells in said group of history cells approaches the quantity of said associated memory cells.

9. The method according to claim 7 and wherein said events comprise programming and erasing and wherein said conditions comprise timing of said programming and said erasing.

10. The method according to claim 9 and wherein said erasing is performed on subgroups of said memory array cells.

11. The method according to claim 9 and wherein said timing is adjusted so that a time lapse between said events experienced by said history cells matches a second time lapse between said events experienced by said associated memory cells.

12. The method according to claim 1 and wherein said history cells and said memory cells are NROM (nitride read only memory) cells.

13. The method according to claim 1 and wherein said history cells and said memory cells are NROM cells operated in one of the following modes: a one bit per cell mode, a dual bit per cell mode, and a multilevel mode.

14. The method according to claim 1 and also comprising programming at least one said history cell and at least one of its said associated memory cells within a short time span of each other.

15. A method according to claim 1 and also comprising changing a programming verify level for programming said array after said memory read reference level has changed.

16. The method according to claim 15 and wherein said programming verify level is returned to its initial level after an erase operation is performed on said array.

17. The method according to claim 1 and also comprising establishing said history read reference levels within the range of a distribution of said program threshold voltage levels interior to a statistically noisy edge of said distribution where the lowest program threshold level occurs.

18. The method according to claim 17 and wherein said history read reference level is the Xth lowest program threshold voltage level in said distribution.

19. The method according to claim 18 and wherein X is 8.

20. The method according to claim 1 and comprising changing a programming verify level for programming said array after said memory read reference level has changed.

21. An array of non-volatile memory cells comprising: a first multiplicity of array cells, divided into groups; a second multiplicity of history cells, divided into groups, each group being associated with and matched to one group of said array cells; a first plurality of history read reference cells for reading said groups of history cells each said history read reference cell defining a different history read reference level; and a second plurality of memory read reference cells for reading said groups of memory cells, each said memory read reference cell defining a different read reference level.

22. The array according to claim 21 and wherein each said group of history cells is one history cell in a row of said memory cells with which it associated.

23. The array according to claim 21 and wherein each said group of history cells is one row of cells above a plurality of rows of said memory cells with which it associated.

24. The array according to claim 21 and wherein each said group of history cells is located near said memory cells with which it associated.

25. The array according to claim 21 and wherein said second plurality of memory read reference cells is one larger than said first plurality of history read reference cells.

26. The array according to claim 21 and wherein said history cells and said memory cells are NROM (nitride read only memory) cells.

27. The array according to claim 21 and wherein said history cells and said memory cells are NROM cells operated in one of the following modes: a one bit per cell mode, a dual bit per cell mode, and a multilevel mode.

28. The array according to claim 21 and wherein each said group of history cells passes substantially the same events at substantially the same conditions as its associated group of memory cells.

29. The array according to claim 21 and wherein the quantity of cells in each said group of history cells approaches the quantity of its said associated memory cells.

30. The array according to claim 21 and wherein each said group of array cells is partitioned into subgroups during erase operations.

* * * * *